United States Patent
Noshadi et al.

(10) Patent No.: US 10,366,939 B2
(45) Date of Patent: Jul. 30, 2019

(54) HEAT SINK FASTENING SYSTEM AND METHOD

(71) Applicant: Harman Becker Automotive Systems GmbH, Karlsbad (DE)

(72) Inventors: Valod Noshadi, Ettlingen (DE); Herbert Kronenwett, Karlsbad (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 0 days.

(21) Appl. No.: 15/787,094

(22) Filed: Oct. 18, 2017

(65) Prior Publication Data

US 2018/0114742 A1 Apr. 26, 2018

(30) Foreign Application Priority Data

Oct. 20, 2016 (DE) .................. 10 2016 220 555

(51) Int. Cl.
| | |
|---|---|
| *H01L 23/40* | (2006.01) |
| *H01L 23/36* | (2006.01) |
| H01L 23/367 | (2006.01) |
| H01L 23/373 | (2006.01) |

(52) U.S. Cl.
CPC ...... *H01L 23/4006* (2013.01); *H01L 23/3672* (2013.01); *H01L 23/3736* (2013.01); *H01L 2224/16227* (2013.01); *H01L 2224/32245* (2013.01); *H01L 2224/73253* (2013.01); *H01L 2924/16251* (2013.01)

(58) Field of Classification Search
CPC ............. H01L 23/4006; H01L 23/4093; H01L 23/467; H01L 23/3672; H01L 23/367; H01L 23/3677; F21V 29/74; F21V 29/773; F21V 29/004; F21V 29/75; H05K 1/0203; H05K 3/0061; H05K 1/0204; H05K 7/209; H05K 1/0209; H05K 1/021; H05K 1/181

See application file for complete search history.

(56) References Cited

U.S. PATENT DOCUMENTS

| | | | | |
|---|---|---|---|---|
| 5,282,111 | A * | 1/1994 | Hopfer | G01R 1/0408 165/185 |
| 5,754,401 | A * | 5/1998 | Saneinejad | H01L 23/433 257/727 |
| 5,870,285 | A * | 2/1999 | Kosteva | H01L 23/4093 165/185 |
| 6,055,159 | A * | 4/2000 | Sun | H01L 23/4093 165/185 |
| 6,519,153 | B1 * | 2/2003 | Shia | H01L 23/36 165/185 |

(Continued)

FOREIGN PATENT DOCUMENTS

| | | |
|---|---|---|
| DE | 20217122 U1 | 2/2003 |
| DE | 60203858 T2 | 2/2006 |

*Primary Examiner* — Adam B Dravininkas
(74) *Attorney, Agent, or Firm* — Brooks Kushman P.C.

(57) ABSTRACT

A system for mounting a heat sink to a printed circuit board includes a frame that is configured to be mounted to a printed circuit board and to receive a heat sink. The heat sink and the frame are formed as separate components. The frame is formed as a rigid component. The system further includes fastening elements that are configured to fix the heat sink to the frame in a mounting position after the heat sink has been inserted into the frame.

15 Claims, 6 Drawing Sheets

(56) References Cited

U.S. PATENT DOCUMENTS

| | | | | |
|---|---|---|---|---|
| 6,570,763 B1* | 5/2003 | McHugh | ............ | H01L 23/4093 |
| | | | | 165/185 |
| 6,606,246 B2* | 8/2003 | Wells | ................. | H01L 23/4093 |
| | | | | 165/185 |
| 6,646,881 B1* | 11/2003 | Lai | ..................... | H01L 23/4006 |
| | | | | 165/80.3 |
| 2001/0010624 A1* | 8/2001 | Katsui | .................... | H01L 23/40 |
| | | | | 361/709 |
| 2003/0058621 A1* | 3/2003 | Wells | ................. | H01L 23/4093 |
| | | | | 361/719 |
| 2003/0137820 A1 | 7/2003 | Chen et al. | | |
| 2004/0085735 A1* | 5/2004 | Liu | .................... | H01L 23/4006 |
| | | | | 361/704 |
| 2004/0252462 A1* | 12/2004 | Cromwell | .......... | H01L 23/4093 |
| | | | | 361/719 |
| 2005/0018404 A1* | 1/2005 | Hein | ................... | H01L 23/4093 |
| | | | | 361/719 |
| 2006/0146500 A1 | 7/2006 | Yatskov | | |
| 2006/0181852 A1* | 8/2006 | Frank | ................. | H01L 23/4006 |
| | | | | 361/704 |
| 2007/0274048 A1* | 11/2007 | Xia | ..................... | H01L 23/4093 |
| | | | | 361/704 |
| 2008/0130233 A1* | 6/2008 | Jin | ..................... | H01L 23/4006 |
| | | | | 361/704 |

* cited by examiner

HEAT SINK FASTENING SYSTEM AND METHOD

CROSS-REFERENCE TO RELATED APPLICATIONS

This application claims foreign priority benefits under 35 U.S.C. § 119(a)-(d) to DE Application Serial No. 10 2016 220 555.2 filed Oct. 20, 2016, the disclosure of which is hereby incorporated in its entirety by reference herein.

TECHNICAL FIELD

The disclosure relates to a system and a method for fastening a heat sink, in particular for fastening a heat sink on a printed circuit board.

BACKGROUND

Heat sinks or heat spreaders are used in many applications for keeping the temperatures of thermally sensitive components or of electronic components having a large heat dissipation below specified temperature limits. Heat sinks usually comprise a metallic body. A thermal interface material (TIM) is typically arranged between this metallic body and the electronic component. The TIM fills the gap between the component surface and the metallic body and enhances the thermal coupling between these two components. The TIM is usually a soft material to protect the electronic component from shocks and vibrations. Physically limited, such soft TIMs possess relatively low thermal conductivities. To compensate for mechanical tolerances of the components, often a rather thick layer of TIM is provided. Low thermal conductivity, in combination with a large TIM thickness, however, increases the thermal resistance of the TIM which decreases the heat transfer through the TIM.

SUMMARY

A system for fastening a heat sink includes a frame that is configured to be mounted to a printed circuit board and to receive a heat sink. The frame and the heat sink are formed as separate components. The frame is formed as a rigid component. The system further includes fastening elements that are configured to fix the heat sink to the frame in a mounting position after the heat sink has been inserted into the frame.

A method for mounting a heat sink to a printed circuit board includes mounting a frame to the printed circuit board. The frame is configured to receive a heat sink. The frame and the heat sink are formed as separate components and the frame is formed as a rigid component. A heat sink is inserted into the frame and arranged in a mounting position. Fastening elements are used for fixing the heat sink in the mounting position.

Other systems, methods, features and advantages will be or will become apparent to one with skill in the art upon examination of the following detailed description and figures. It is intended that all such additional systems, methods, features and advantages be included within this description, be within the scope of the invention and be protected by the following claims.

BRIEF DESCRIPTION OF THE DRAWINGS

The system and method may be better understood with reference to the following description and drawings. The components in the figures are not necessarily to scale, emphasis instead being placed upon illustrating the principles of the invention. Moreover, in the figures, like referenced numerals designate corresponding parts throughout the different views.

DETAILED DESCRIPTION

Figure 1:
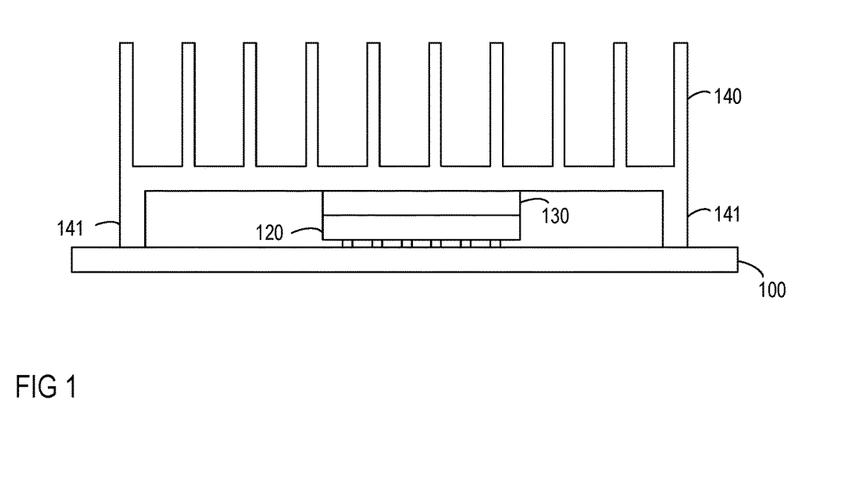
FIG. 1 is a schematic diagram illustrating a heat sink mounted on a printed circuit board.

FIG. 1 illustrates in a schematic diagram a printed circuit board 100 and an electronic component 120 mounted on the printed circuit board. The electronic component 120 may be soldered to the printed circuit board 100, for example. This is, however, only an example. The electronic component 120 may be fixed on the printed circuit board 100 in any suitable way. A conventional heat sink 140 is arranged on the printed circuit board 100. In the following, the term "heat sink" is used to denote a device, for example, a metallic body that is configured to transfer the heat that is generated by an electronic component or by a metallic device to a fluid medium such as air or a liquid coolant, thereby allowing regulation of the device's temperature at optimal levels. The heat sink 140 has legs 141 for mounting the heat sink 140 to the printed circuit board 100. The legs 141 of the heat sink 140 may be, for example, soldered or screwed to the printed circuit board 100. In this way, the heat sink 140 is arranged above the electronic component 120. A layer of thermal interface material (TIM) 130 is arranged between the electronic component 120 and the heat sink 140, completely filling a gap between the electronic component 120 and the heat sink 140. The TIM 130 is configured to enhance the thermal coupling between the electronic component 120 and the heat sink 140. When the heat sink 140 is mounted directly to the printed circuit board 100, as is illustrated in FIG. 1, the thickness of the TIM 130, however, may be too large. A large thickness of the TIM 130 results from a long tolerance chain (accumulation of tolerances). The tolerance chain may include, for example, tolerances of the thickness of the printed circuit board 100, the thickness of the solder that is used to mount the electronic component 120 to the printed circuit board 100, the height of the electronic component 120 and the dimensions of the heat sink 140. Several tolerances, in sum, may grow to relatively large tolerance values to be compensated.

Figure 2:
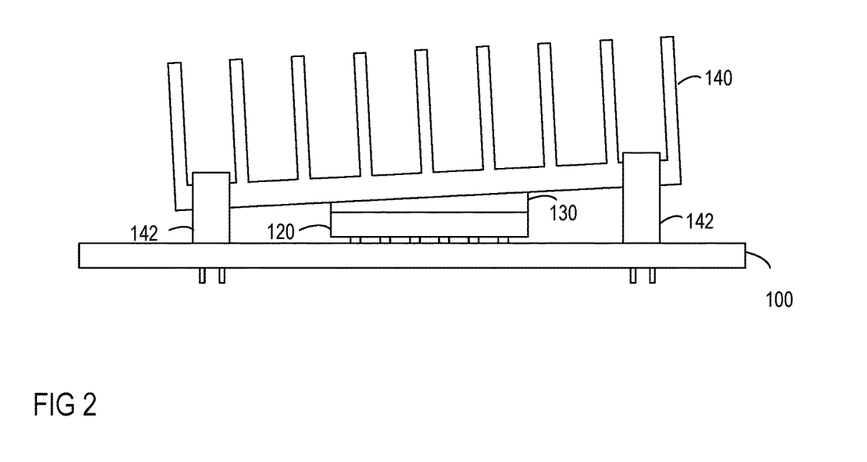
FIG. 2, is a schematic diagram of another heat sink mounted on a printed circuit board.

A conventional system including spring elements 142 is illustrated in FIG. 2. Two or more spring elements 142 may be arranged on the printed circuit board 100. The spring elements 142 are configured to couple the heat sink 140 to the printed circuit board 100. The spring elements 142 apply a force to the heat sink 140 which is pulled in the direction of the printed circuit board 100 as a consequence of this force. This, however, may exert unwanted direct force on the electronic component 120 and the printed circuit board 100. Furthermore, problems may arise, for example, when the electronic components 120 mounted on the printed circuit board 100 are not centered between the spring elements 142. There is, therefore, a danger that the heat sink 140 tilts, as is illustrated in FIG. 2. A tilting of the heat sink 140 may exert harmful mechanical stress on the electronic component 120.

Figure 3:
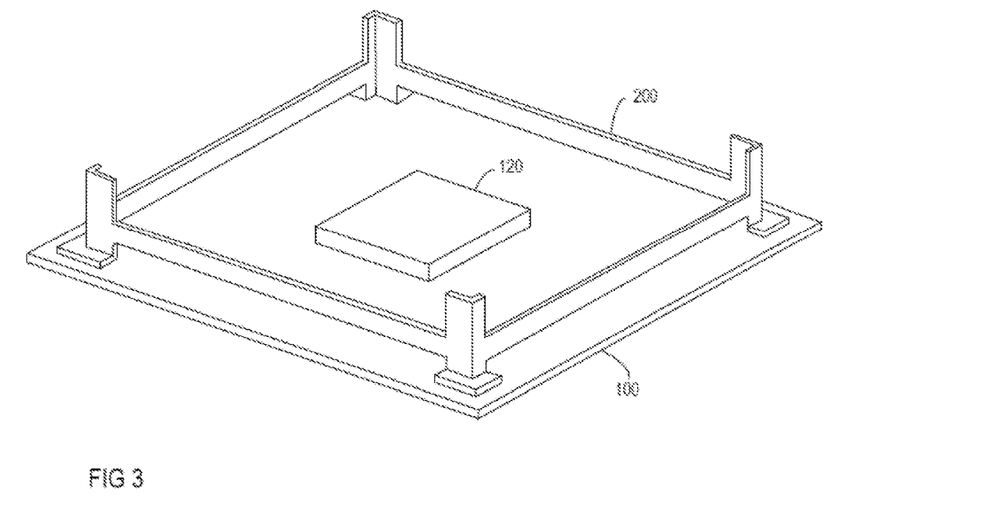
FIG. 3, illustrates in a schematic diagram an exemplary system for mounting a heat sink, before mounting the heat sink.

To avoid the above-mentioned disadvantages, the system for mounting a heat sink 140 to a printed circuit board 100, as disclosed herein, includes a frame 200. The frame 200 is configured to receive a heat sink 140 and to support the heat sink 140 once it is inserted into and mounted to the frame 200. The frame 200 and the heat sink 140 are manufactured and provided as separate components. The frame 200 may be mounted on the printed circuit board 100. For example, the frame 200 may be soldered or screwed to the printed circuit board 100. These are, however, only examples. The frame 200 may be mounted on the printed circuit board 100 in any suitable way. In contrast to the spring elements 142 as described in FIG. 2, the frame 200 is formed as a rigid component. The term "rigid component" as used herein designates a component that has a fixed shape, size and height and that is not significantly deformed when a force is applied to the component during normal handling of the component. The frame 200 may be a metallic frame and include materials such as, for example, steel. In one example, the frame 200 is made from a steel plate. The frame 200 may be formed, for example, using a stamping process. However, any other materials or processes may be used for forming a frame 200. In another example, the frame 200 is a die cast part. The frame 200 may be formed as one piece, as is illustrated in the example of FIG. 3. The contour or the outline of the frame 200 may be substantially the same as the contour or the outline of the heat sink 140 that is to be inserted into the frame 200. The frame 200 may have, for example, a square or a rectangular contour or outline. However, any other contour or outline is also possible. The frame 200 may have four lateral surfaces, as is illustrated in the example of FIG. 3. A leg may be formed in each corner where two of the lateral surfaces meet. The legs may be mounted to the printed circuit board 100, while the lateral surfaces are arranged distant to the printed circuit board 100. This is, however, only an example. It is also possible to directly couple the lateral surfaces to the printed circuit board 100. In further examples, the frame 200 may not include any legs.

Figure 4:
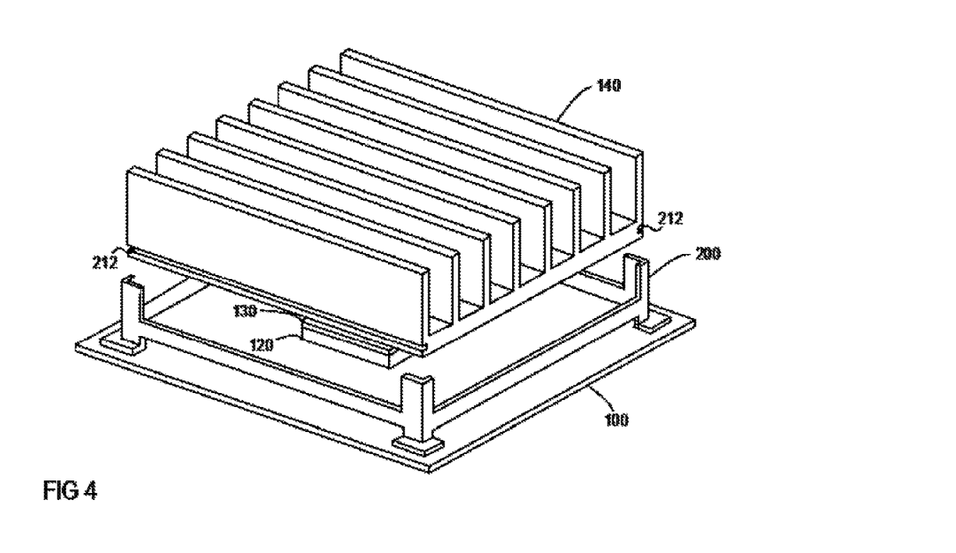
FIG. 4 illustrates in a schematic diagram the exemplary system of FIG. 3, while mounting the heat sink.

At least one electronic component 120 may be mounted on the printed circuit board 100. The frame 200 may be arranged on the printed circuit board 100 such that at least one electronic component 120 is arranged within the contour or the outline of the frame 200. A heat sink 140 may be inserted into the frame 200, as is illustrated in FIG. 4. Before inserting the heat sink 140 into the frame 200, a layer of TIM 130 may be applied to the upper surface of the at least one electronic component 120 that is arranged within the contour of the frame 200. Alternatively, the layer of TIM 130 may be applied to the heat sink 140 in those areas that will later contact the at least one electronic component 120. When the heat sink 140 has been inserted into the frame 200, it may be fixed to the frame 200 with fastening elements. The height of the heat sink 140 in relation to the printed circuit board 100 and in relation to the electronic component 120 thereon may be adjustable. The distance between the heat sink 140 and the printed circuit board 100, or between the heat sink 140 and the electronic component 120, respectively, depends on the position of the heat sink 140 in relation to the frame 200. When inserting the heat sink 140 into the frame 200, the distance between the electronic component 120 and the heat sink 140 may be adjusted such that the heat sink 140 is pressed on the TIM 130 and therefore the electronic component 120 with a small force, thereby reducing the thickness of the TIM 130 between the electronic component 120 and the heat sink 140 to a first thickness. In particular, a lower surface of the heat sink 140 may be arranged adjacent to an upper surface of the TIM 130. The heat sink 140 may then be fixed in a mounting position. The mounting position of the heat sink 140 may be a position in which the thickness of the TIM 130 equals the first thickness. The first thickness may be a thickness of the TIM 130, at which it provides an optimal thermal conductivity. In its mounting position, a lower surface of the heat sink 140 facing the printed circuit board 100 may be substantially parallel to the printed circuit board 100. For example, the first thickness may be about 0.2 mm. This is, however, only an example. The first thickness usually depends on the material that is used for the TIM 130. The TIM 130 may be provided in the form of a pad or a dispensable one- or two-component gap filler and may include, for example, epoxies, epoxy resins, cyanoacrylate, silicones, urethanes, boron nitride, zinc oxide, metals, metal oxides, silica or ceramic microspheres. Depending on the material that is used for the TIM 130, the first thickness may be smaller or greater than 0.2 mm.

Figure 5:
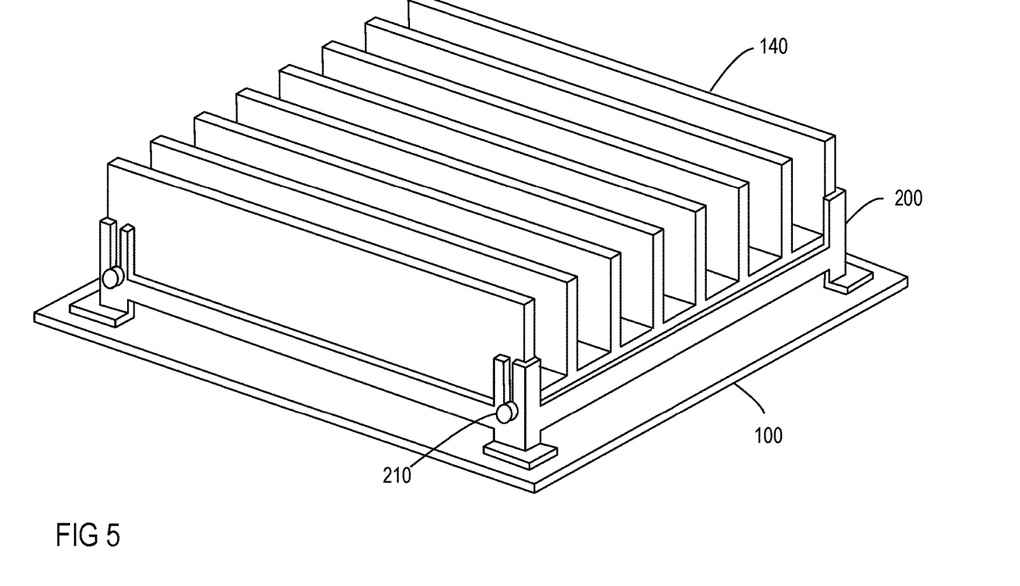
FIG. 5 illustrates in a schematic diagram an exemplary system for mounting a heat sink, after mounting the heat sink.
Figure 6:
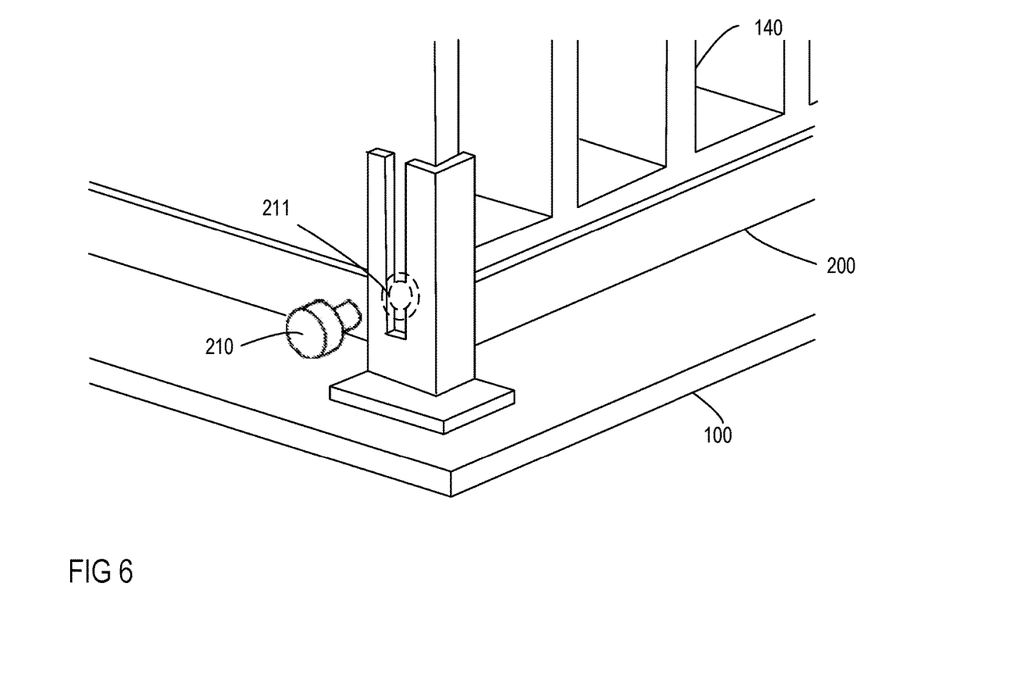
FIG. 6 illustrates in a schematic diagram a part of the exemplary system of FIG. 5 in more detail.

As is illustrated in the example of FIG. 5, a fastening element that is used to fix the heat sink 140 on the frame 200 may include at least one screw 210. The frame 200 may include, for example, vertical slots. The vertical slots may be open to one side as is illustrated in FIG. 5. The slots, however, may also be closed to both sides and have an elongated form in a direction that is perpendicular to an upper surface of the printed circuit board 100, to allow an adjustment of the height of the heat sink 140 or, in particular, an adjustment of the distance between the printed circuit board 100 and the heat sink 140. A threaded portion of the screws 210 may be inserted into and pass through the vertical slots and into the heat sink 140. The heat sink 140 may include threaded holes 211, as is illustrated in FIG. 6. The height of the heat sink 140 may be adjusted before tightening the screws 210 and may then be fixed in place by inserting the threaded portion of the screws 210 into the threaded holes 211 and tightening the screws 210. The diameter of the screw head may be greater than the width of the vertical slot to block the passage of the screw head through the vertical slot and allow the fixation of the heat sink 140 in its mounting position. Two or more screws 210 may be used to fix the heat sink 140 in place. For example, one screw 210 may be inserted into one vertical slot at each of the four corners of a rectangular shaped heat sink 140.

Instead of threaded holes 211, the heat sink 140 may include grooves 212 on two or more of its sides. Such grooves 212 are exemplarily illustrated in the schematic diagram of FIG. 4. If the heat sink 140 includes grooves, the screws 210 may be inserted into and pass through the vertical slots and into the grooves 212 of the heat sink 140. The screws 210 may be self-forming or self-tapping screws. A self-forming or self-tapping screw is a screw that can tap its own hole as it is driven into the material. The screw tip may be inserted into the groove 212 before tightening the screw 210. The height of the heat sink 140 may be adjusted before tightening the screws 210. By tightening the screws 210, the heat sink 140 is then fixed in place.

Figure 7:
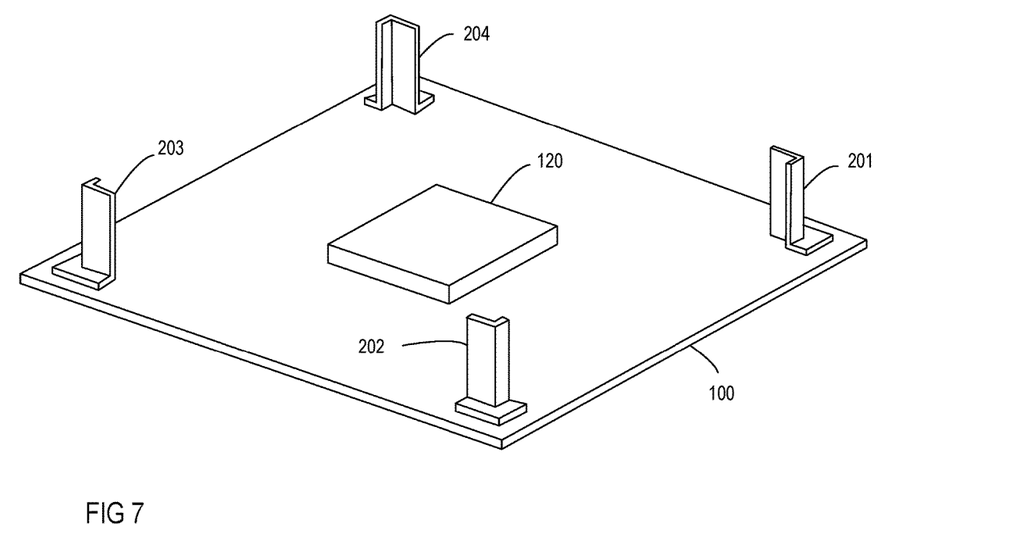
FIG. 7 illustrates in a schematic diagram another exemplary system for mounting a heat sink, before mounting the heat sink.
Figure 8:
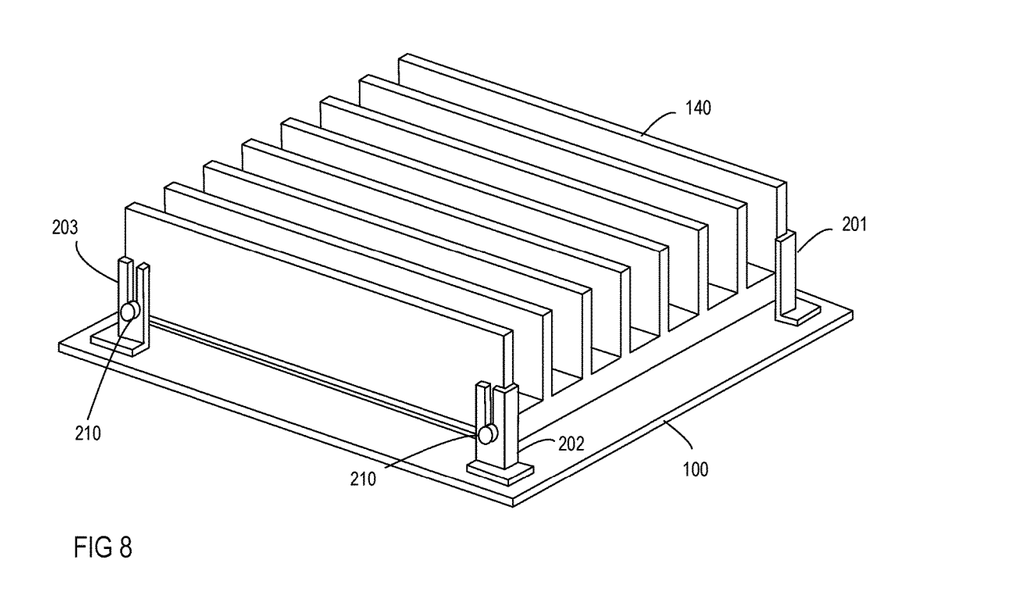
FIG. 8 illustrates in a schematic diagram the exemplary system of FIG. 7, after mounting the heat sink.

The frame 200, however, does not need to be formed as a unitary component as illustrated in FIGS. 3-6. As is illustrated in FIG. 7, the frame 200 may include and be formed of two or more separate parts 201, 202, 203, 204 that are each separately mounted to the printed circuit board 100. For example, one separate part 201, 202, 203, 204 may be arranged in each corner of a rectangular heat sink 140, as is illustrated in FIG. 8. The parts 201, 202, 203, 204 may each be a rigid part. Each of the parts 201, 202, 203, 204 may include a vertical slot. The heat sink 140 may be fixed to each of the parts 201, 202, 203, 204 of the frame 200 using screws, as has been explained by FIGS. 5 and 6 above. However, using screws for fixing the heat sink 140 is only an example. The heat sink 140 may be fixed to the multi-part frame using any other suitable fastening element. Arranging parts 201, 202, 203, 204 of the frame 200 at the corners of a heat sink 140 is only an example. Parts 201, 202, 203, 204 of a frame 200 may be positioned in any other position in relation to the heat sink 140 that allow the heat sink 140 to be securely fixed in place on the frame 200 in its mounting position.

Figure 9:
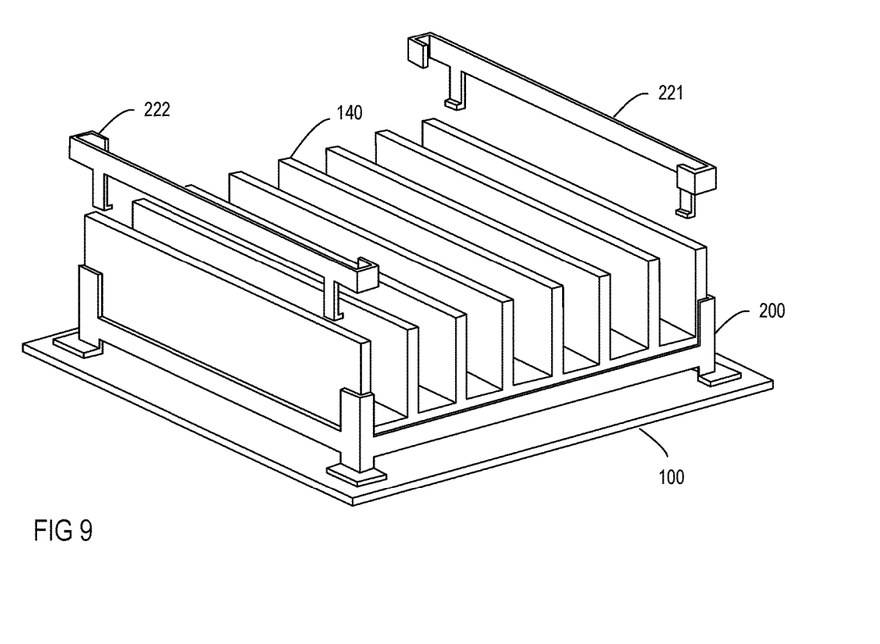
FIG. 9 illustrates in a schematic diagram another exemplary system for mounting a heat sink, while mounting the heat sink.
Figure 10:
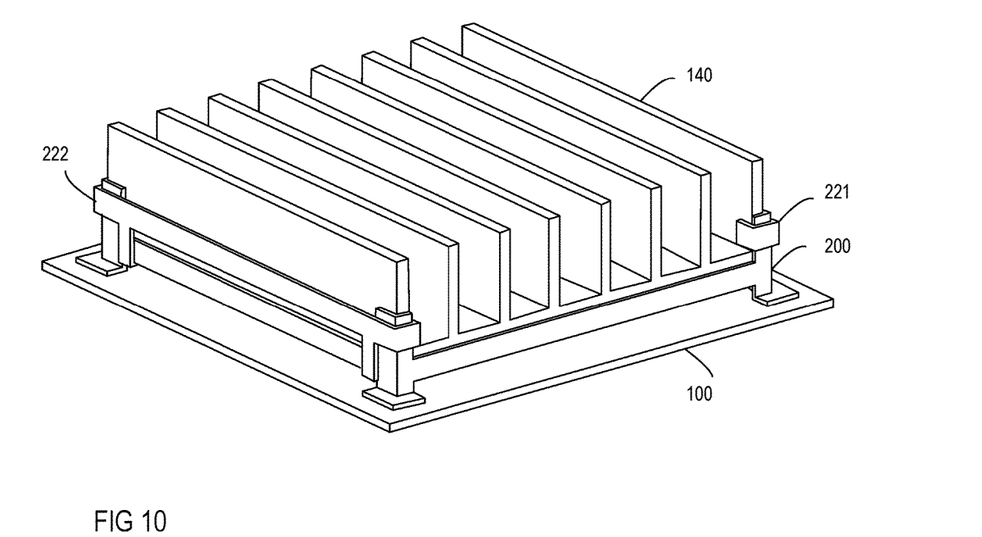
FIG. 10 illustrates in a schematic diagram the exemplary system of FIG. 9, after mounting the heat sink.

Now referring to FIG. 9, the fastening element may include one or more clamps 221, 222. One or more first parts of the clamps 221, 222, for example, first snap-arms, may embrace the heat sink 140 while other second parts, e.g., second snap-arms, of the clamps 221, 222 embrace the frame, thereby fastening the heat sink 140 to the frame 200. The form and the size of the frame 200 and the clamps 221, 222 may be chosen such that the heat sink 140 is held at the ideal height in which the thickness of the TIM 130 that is arranged on the electronic component 120 is reduced to the first thickness. FIG. 10 illustrates the arrangement after securely locking the clamps 221, 222 in place, thereby fixing the heat sink 140 to the frame 200. In FIGS. 9 and 10 two clamps 221, 222 are illustrated for fixing the heat sink 140 to the frame 200. This is however only an example. Only one clamp 221, 222 or more than two clamps 221, 222 may be used for fixing the heat sink 140 to the frame 200. The clamps 221, 222 may have any shape that is suitable to engage the frame 200 and the heat sink 140 and securely hold the heat sink 140 in its mounting position.

Using screws 210 or clamps 221, 222 to fix the heat sink 140 to the frame 200 are, however, only examples. Any other fastening element may be used that is configured to fix the heat sink 140 to the frame 200, such that the heat sink 140 is held in place and the thickness of the TIM 130 arranged between the electronic component 120 and the heat sink 140 may equal a first thickness, at which the TIM 130 provides an optimal thermal conductivity.

Figure 11:
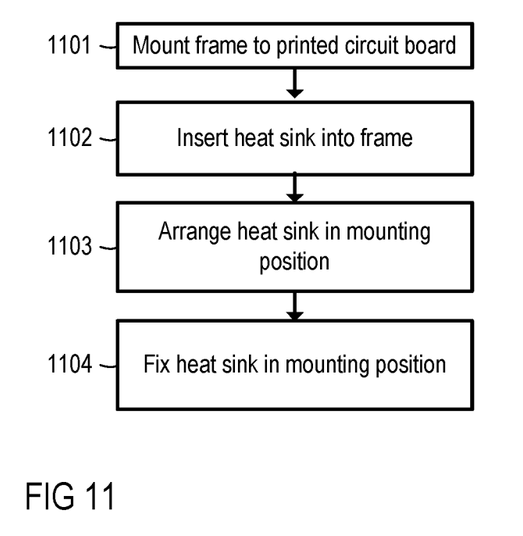
FIG. 11 illustrates in a flow chart a method for mounting a heat sink to a printed circuit board.

In FIG. 11 a method is illustrated for mounting a heat sink to a printed circuit board. In a first step (step 1101), a frame is mounted on a printed circuit board. The frame is configured to receive a heat sink and is formed as a rigid component. The frame and the heat sink are formed as separate components. A heat sink is inserted into the frame (step 1102) and is arranged in a mounting position (step 1103). The heat sink is then fixed to the frame in the mounting position (step 1105) using fastening elements.

The frame may be arranged on the printed circuit board such that at least one electronic component is arranged within the contour of the frame. A layer of thermal interface material may be formed on an upper surface of the electronic component facing away from the printed circuit board or on a lower surface of the heat sink. This layer of thermal interface material may be formed on the electronic component or the heat sink before mounting the frame on the printed circuit board or after mounting the frame on the printed circuit board. The heat sink may be arranged in the frame such that the lower surface of the heat sink is arranged adjacent to an upper surface of the thermal interface material facing away from the printed circuit board or such that the layer of thermal interface material arranged on the lower surface of the heat sink is arranged adjacent to an upper surface of the electronic component facing away from the printed circuit board. A force may be applied to the heat sink, thereby applying a force to the thermal interface material and reducing a thickness of the thermal interface material to a first thickness, the heat sink being in the mounting position when the thickness of the thermal interface material equals the first thickness.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A system for mounting a heat sink to a printed circuit board, the system comprises:
   a frame that is configured to be mounted to a printed circuit board and to receive a heat sink, wherein the frame and the heat sink are formed as separate components, and wherein the frame is formed as a rigid component; and
   fastening elements that are configured to fix the heat sink to the frame after the heat sink has been inserted into the frame,
   wherein the fastening elements comprise at least one screw or at least one clamp,
   wherein the heat sink comprises at least one threaded hole or at least one groove, and
   wherein the frame comprises at least one vertical slot and the at least one screw comprises a threaded portion that is configured to be inserted into and pass through a vertical slot into one threaded hole or one groove, wherein the heat sink is fixed to the frame by tightening the at least one screw in the at least one threaded hole or the at least one groove.

2. The system of claim 1, wherein a position of the heat sink in relation to the frame is adjustable.

3. The system of claim 2, wherein a distance between the printed circuit board and the heat sink depends on the position of the heat sink in relation to the frame.

4. The system of claim 1, wherein the at least one screw is a self-forming or a self-tapping screw.

5. The system of claim 1, wherein the at least one clamp includes:
   one or more first parts that are configured to embrace the heat sink; and
   one or more second parts that are configured to embrace the frame.

6. The system of claim 1, wherein the frame comprises a metallic material.

7. The system of claim 1, wherein the frame is formed as a unitary component.

8. The system of claim 1, wherein the frame comprises two or more separate components.

9. A method for mounting a heat sink to a printed circuit board, the method comprising:
- mounting a frame to the printed circuit board, wherein the frame is configured to receive a heat sink, wherein the frame and the heat sink are formed as separate components, and wherein the frame is formed as a rigid component;
- inserting the heat sink into the frame;
- arranging the heat sink in a mounting position; and
- fixing the heat sink in the mounting position with fastening elements,
- wherein fixing the heat sink in the mounting position comprises:
- inserting at least one screw through at least one vertical slot of the frame and into at least one threaded hole or at least one groove of the heat sink; and
- tightening screws to fix the heat sink in the mounting position.

10. The method of claim 9, wherein at least one electronic component is arranged on the printed circuit board, and wherein the method further comprises:
- mounting the frame to the printed circuit board, such that the at least one electronic component is arranged within the frame;
- forming a layer of thermal interface material on an upper surface of the electronic component facing away from the printed circuit board or on a lower surface of the heat sink;
- inserting the heat sink into the frame such that the lower surface of the heat sink is arranged adjacent to an upper surface of the thermal interface material facing away from the printed circuit board or such that the layer of thermal interface material arranged on the lower surface of the heat sink is arranged adjacent to the upper surface of the electronic component; and
- applying a force to the heat sink and to the thermal interface material.

11. The method of claim 10, wherein the heat sink is fixed in the mounting position with at least one clamp, wherein one or more first parts of the at least one clamp is configured to embrace the heat sink, and one or more second parts of the at least one clamp are configured to embrace the frame.

12. A system for mounting a heat sink to a printed circuit board, the system comprises:
- a frame being formed of a rigid component and being configured to be mounted to a printed circuit board and to receive a heat sink, wherein the frame and the heat sink are formed as separate components; and
- fastening elements that are configured to fix the heat sink to the frame after the heat sink has been inserted into the frame,
- wherein the fastening elements comprise at least one screw or at least one clamp,
- wherein the heat sink comprises at least one threaded hole or at least one groove, and
- wherein the frame comprises at least one vertical slot and the at least one screw comprises a threaded portion that is configured to be inserted into and pass through a vertical slot into one threaded hole or one groove, wherein the heat sink is fixed to the frame by tightening the at least one screw in the at least one threaded hole or the at least one groove.

13. The system of claim 12, wherein a position of the heat sink in relation to the frame is adjustable.

14. The system of claim 13, wherein a distance between the printed circuit board and the heat sink depends on the position of the heat sink in relation to the frame.

15. The system of claim 12, wherein the fastening elements comprise at least one screw or at least one clamp.

* * * * *